United States Patent
Ray et al.

(10) Patent No.: US 6,832,827 B2
(45) Date of Patent: Dec. 21, 2004

(54) CLEANING NOZZLE

(75) Inventors: John F. Ray, Canaan, NH (US); Thomas B. Alexander, White River Junction, VT (US); Frederick H. Amidon, Jr., Cornish, NH (US); Carl A. Tracy, Enfield, NH (US)

(73) Assignee: Spectra, Inc., Lebanon, NH (US)

( * ) Notice: Subject to any disclaimer, the term of this patent is extended or adjusted under 35 U.S.C. 154(b) by 0 days.

(21) Appl. No.: 10/328,458

(22) Filed: Dec. 23, 2002

(65) Prior Publication Data

US 2003/0156152 A1 Aug. 21, 2003

Related U.S. Application Data

(60) Provisional application No. 60/344,148, filed on Dec. 26, 2001.

(51) Int. Cl.[7] ................................................ B41J 2/165

(52) U.S. Cl. ............................................ 347/22; 347/25
(58) Field of Search ................................. 347/22, 25, 28; 134/18, 34, 95.1; 239/290, 424, 424.5, 434.5; 255/155; 15/415.1

(56) References Cited

U.S. PATENT DOCUMENTS 5,793,389 A * 8/1998 Mitchell ..................... 347/28

* cited by examiner

*Primary Examiner*—Shih-Wen Hsieh
(74) *Attorney, Agent, or Firm*—Fish & Richardson P.C.

(57) ABSTRACT

In an aspect, the invention features an apparatus and method for cleaning with a flow of gas. In embodiments, a gas cleaning assembly is provided that includes a nozzle outlet that directs cleaning gas, e.g., toward a work piece, and a sheath gas jacket surrounding at least a portion of the nozzle that directs a sheath gas into contact with the nozzle.

11 Claims, 4 Drawing Sheets

CLEANING NOZZLE

CROSS-REFERENCE TO RELATED APPLICATIONS

This application claims priority to Provisional Patent Application 60/344,148, entitled "CLEANING NOZZLE," filed on Dec. 26, 2001, the entire contents of which are hereby incorporated by reference.

TECHNICAL FIELD

This invention relates to cleaning small parts, such as ink jet print head components, with a flow of gas from a nozzle.

BACKGROUND

In ink jet printing, ink is ejected from a narrow orifice in the direction of a substrate. In one type of ink jet printing, known as drop on demand printing, the ink is ejected in a series of droplets. The droplets may be produced and controlled using a piezoelectric ink jet head which has a large number of orifices, each of which is separately controllable to selectively eject ink at desired locations, or pixels, of the image. For example, an ink jet head may have 256 orifices that have a spacing for a printing resolution of 100 pixels (dots) per inch (dpi) or more. This dense array of orifices allows complex, highly accurate images to be produced. The quality of the images suffers, however, if one or more of the orifices becomes obstructed. For example, a partially obstructed orifice may alter the direction, size, or stability of the droplets. A drop on demand piezoelectric print head is described in U.S. Pat. No. 4,825,227, the entire contents of which is incorporated herein by reference.

SUMMARY

In an aspect, the invention features an apparatus and method for cleaning with a flow of gas. In embodiments, a gas cleaning assembly is provided that includes a nozzle outlet that directs cleaning gas, e.g., toward a work piece, and a sheath gas jacket surrounding at least a portion of the nozzle that directs a sheath gas into contact with the nozzle. Embodiments may also include one or more of the following. The nozzle outlet and sheath gas jacket direct the sheath gas and cleaning gas generally toward a work piece. The sheath gas jacket and nozzle outlet direct the sheath gas and cleaning gas in generally opposite directions. The nozzle outlet and the sheath gas jacket direct the sheath gas both in a direction generally toward the work piece and generally away from the work piece. The flow of the sheath gas towards the work piece may be less than the flow away from the work piece. The sheath gas jacket is a generally tubular fitting having a first opening adapted to receive an exit end of the nozzle outlet and a second opening adapted to receive an inlet end of the nozzle outlet. The sheath gas jacket includes a sheath gas inlet for introducing sheath gas between the first opening and second opening.

In another aspect, the invention features a method using a gas cleaning nozzle by directing a cleaning gas through a nozzle and directing a sheath gas around the nozzle. The cleaning gas could be, for example, carbon dioxide. The sheath gas could be, for example either nitrogen or conditioned air.

Embodiments may have one or more of the following advantages. The sheath gas prevents condensation and ice buildup. A low flow of sheath gas surrounding the cleaning gas isolates the cleaning gas from humid environments while a high flow through the sheath gas jacket isolates the nozzle. The sheath gas jacket allows the user to clean a work piece without the problem of drops of water or particles of ice contaminating the work piece during a cleaning process. Other features, objects, and advantages of the invention will be apparent from the description and drawings, and from the claims.

DETAILED DESCRIPTION

Figure 1:
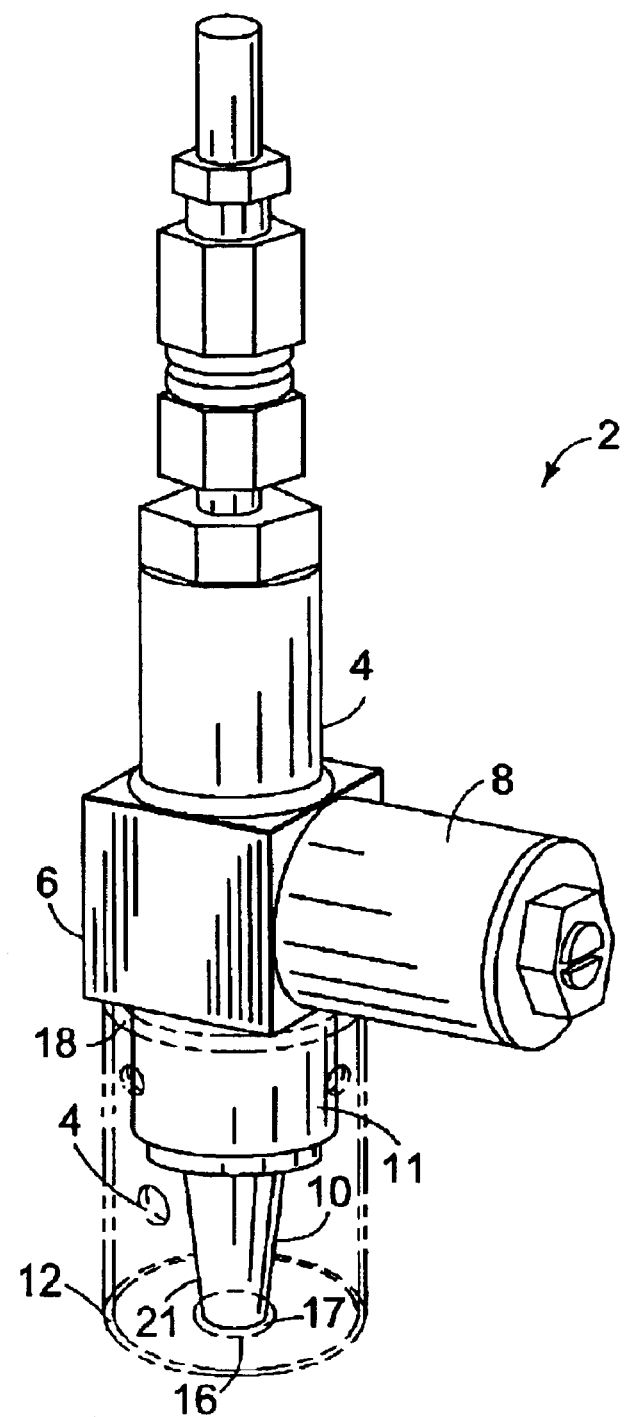
FIG. 1 is a perspective view of a cleaning nozzle assembly including a sheath gas jacket.

Referring to the FIGS., a cleaning nozzle assembly 2 includes an inlet connector 4 for connection to a source of high pressure gas (not shown), a valve body 6 and an on/off solenoid 8 for controlling the gas flow, and a nozzle 10, assembled to the valve body with a nut 11, for directing the flow of cleaning gas (double arrows 15), e.g. towards a work piece 30 to be cleaned. As the cleaning gas expands through the nozzle, it cools. The cleaning nozzle assembly 2 also includes a sheath gas jacket 12 (in phantom, FIG. 1) for maintaining sheath gas (arrows 14) around the nozzle 10 to prevent water vapor condensation on the nozzle 10 or work piece 30 due to the cooling effect of the cleaning gas.

The sheath gas jacket 12 is assembled over the nozzle portion 10. The sheath gas jacket includes a lower aperture 16, near the exit end 17 of the nozzle 10. The sheath gas jacket 12 also includes a upper aperture 20 positioned around the nozzle nut 11. The sheath gas jacket 12 includes a gas inlet connection 4 for introducing the sheath gas from a source (not shown). The sheath gas purges water vapor from the region around the nozzle and largely isolates this region from the surrounding atmosphere. It is desirable that the pressure of the sheath gas in the sheath gas jacket is at least slightly above atmospheric pressure and that there is some positive flow from within the chamber to the atmosphere.

Figure 2A:
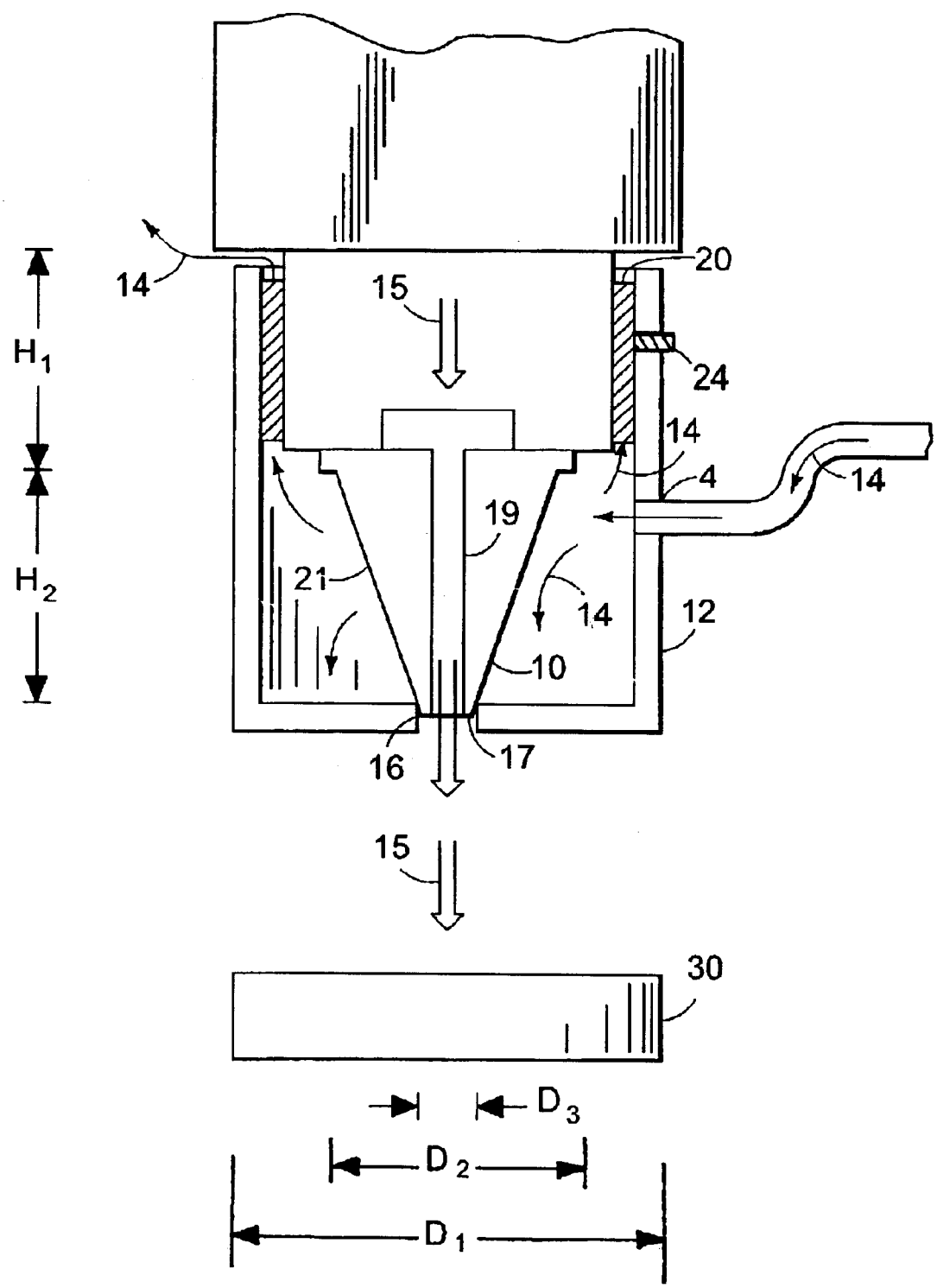
FIGS. 2A and 2B are cross-sections of embodiments of cleaning nozzle assemblies illustrating the flow of gases.

Referring particularly to FIG. 2A, in one embodiment, exit end 17 of the nozzle extends into the lower aperture 16 of the sheath gas jacket 12 so that the nozzle effectively prevents the flow of sheath gas from the lower aperture. Sheath gas may, however, flow through the upper aperture 20 of the sheath gas jacket 12. In this embodiment, the upper aperture 20 fits closely around the nozzle nut 11, which includes a knurled outer surface, creating interstices through which sheath gas may flow from the region around the nozzle to the ambient atmosphere. As illustrated, the cleaning gas 15 flows from the valve body into a jet insert 19, having a small diameter inlet and a larger diameter outlet. The jet insert is typically metal. A cone shaped ceramic piece 21 surrounds and supports the jet insert. As the cleaning gas 15 flows, it cools due to the Joule-Thompson effect. The cold gas in turn tends to cool the downstream components of the nozzle and the work piece 30, creating the possibility that water may condense and freeze on these surfaces, interrupting the flow of the cleaning gas 15 and reducing the efficiency of the cleaning process. The sheath gas 14 isolates the nozzle 10 from the atmosphere and/or facilitates evaporation of condensation before it freezes. The sheath gas 14 flows into the sheath gas jacket 12 through the inlet connection 4. The sheath gas 14 circulates around the cone shaped nozzle 10 and exits through the top of the sheath gas jacket 12.

Figure 2B:
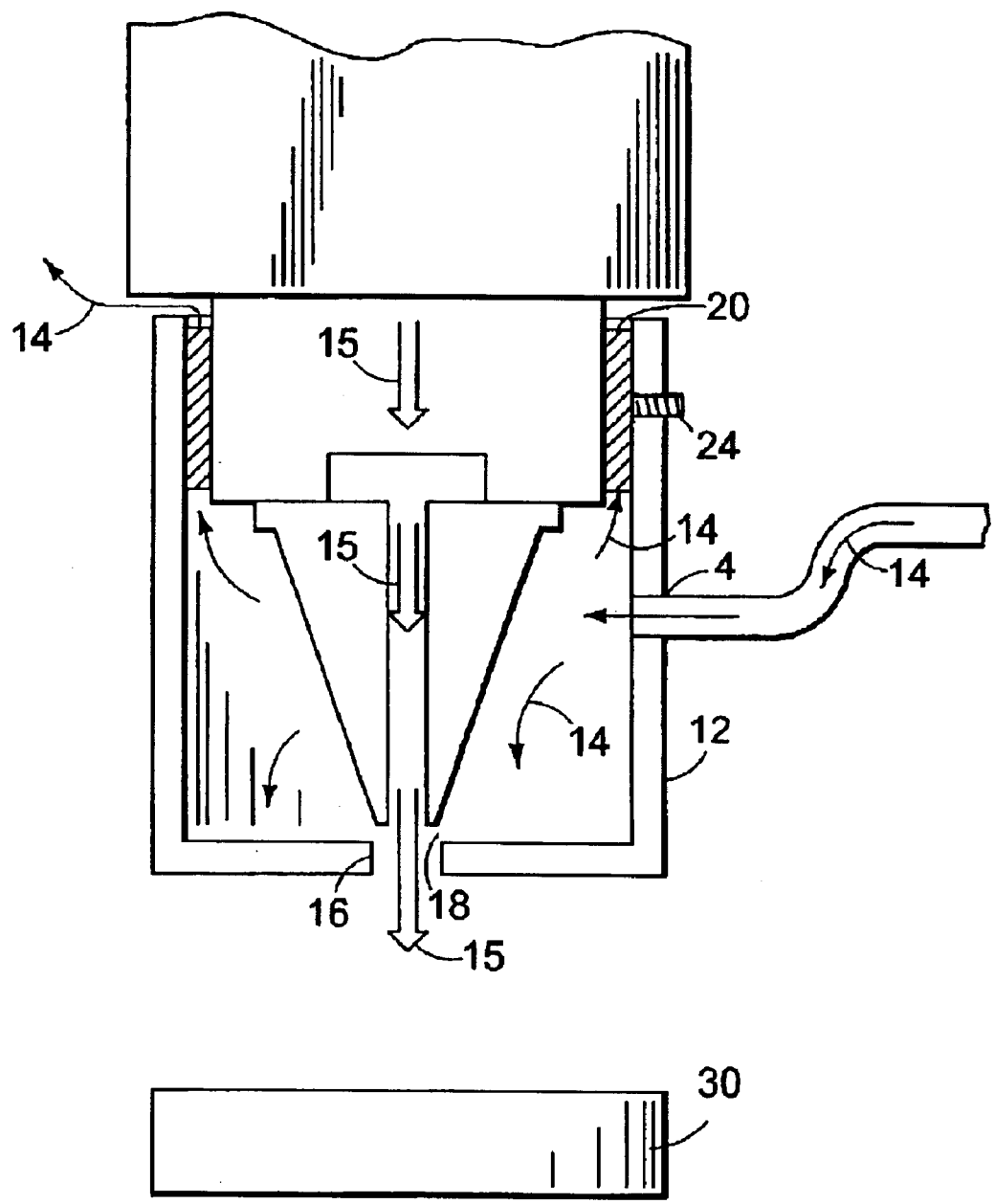

Referring particularly to FIG. 2B, in another embodiment, sheath gas flows both from the upper aperture 22 and the lower aperture 16 of the sheath gas jacket 12. In this case, the exit end of the nozzle is positioned in the lower aperture 16 to create an annular gap 18 through which sheath gas can flow. The sheath gas surrounds the cleaning gas as it exits the nozzle assembly. Preferably the gas flow through the gap 18 is about 50% or less, e.g., about 25% of the total flow out of the sheath jacket. The low flow of sheath gas 14 toward the work piece 30 is sufficient to sheath the cleaning gas without interrupting its flow pattern or creating excessive turbulence. The diameter of the exit end of the nozzle and the size of the lower aperture of the sheath gas jacket can be chosen so that the exit end of the nozzle protrudes from the sheath gas jackets and sheath gas flows around the exit end of the nozzle. The diameter of the exit end of the nozzle can be reduced by, for example, removing the lower part of the conical ceramic support and exposing the end of the jet insert.

In some embodiments, the cleaning nozzle assembly 2 is Vatran carbon dioxide cleaning system, available as the Snowgun, with nozzle model S62-NN-63 having a jet inlet of about 0.013 inch, from Vatran Systems, Inc., Carla Vista, Calif. The nozzle nut 11 has a diameter, $D_1$, of about 1.006 inch (nominal about 1 inch, knurl about 0.006 inch) and a height, $H_1$, of about 0.734 inch. The conical portion has diameter, $D_2$ of about 0.5 inch and tapers to a tip diameter, $D_3$, of about 0.125 inch over, $H_2$, about 0.5 inch. The exit opening of the jet insert is about 0.055 inch (ID).

Figure 3A:
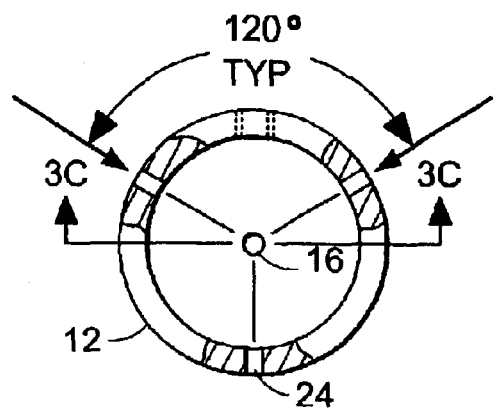
FIGS. 3A, 3B, and 3C are respectively the top, side and profile of an embodiment of a sheath gas jacket.
Figure 3B:
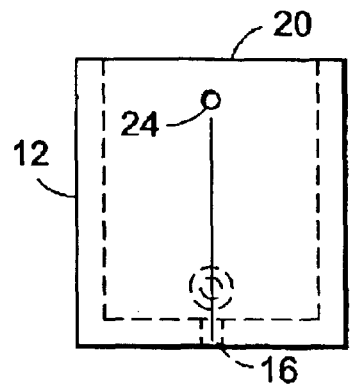
Figure 3C:
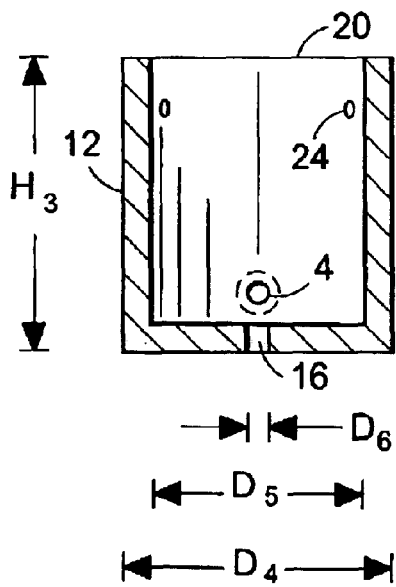

Referring particularly to FIGS. 3A-C, the sheath gas jacket 12 is machined from aluminum or Delrin and has a height, $H_3$, of about 1.32 inch, outer diameter, $D_4$, of about 1.708 inch and inner diameter, $D_5$, of about 1.008 inch. Mounting screws 24 are located about 0.35 inch from the top of the jacket and positioned 120 degrees apart around the sheath gas jacket 12. The mounting screws bear upon the nozzle nut. Referring to FIG. 3B, the opening in the bottom of the sheath gas jacket is, $D_5$, about 0.205 inch in diameter. The sheath gas inlet is ⅛ inch NPT fitting spaced about 0.365 inch above the bottom of the jacket.

In applications, the cleaning gas may be pressurized carbon dioxide, provided at a pressure of about 800 psi. Other cleaning gases include air or nitrogen that has been passed through a desiccant, to remove water, and a filter to remove particles. The pressure of the sheath gas can range, e.g., 25 to 100 psi. Once the region about the nozzle has been purged, only a low flow of sheath gas is needed to maintain a moisture-free region in the sheath gas jacket.

Referring particularly to FIG. 2A, the cleaning nozzle assembly 2 may be used to clean fluid pathways in ink jet print head components, such as the ink jet nozzle plates 30. The nozzle plates 30 include small, closely spaced (e.g. 0.020 inch) apertures 34 through which ink is ejected. During manufacture and use, the nozzle plates 30 may become blocked or partially blocked. In addition, contamination on the nozzle plate 30 surface near the apertures can effect drop formation. For example, during manufacture of inkjet manifolds to which nozzle plates are bonded, the manifolds are typically treated with a mild abrasive in an aqueous solution to improve flatness. The abrasive particles must be cleaned from the manifold passages which lead to the inkjet nozzles before use. A flow of high pressure cleaning gas may be effective for removing the particles. The sheath gas prevents the formation of condensation on the nozzle or the workpiece. The use of the sheath gas is particularly advantageous when cleaning in atmospheres of high humidity, and/or utilizing long cleaning gas flow on-times and/or high gas flow duty cycles. For example, when cleaning relatively large pieces in a production line in a continuous manner with the flow of cleaning gas on for an extended period, e.g. five seconds, one minute or more, the cleaning nozzle can become significantly colder than the atmosphere. In addition, high duty cycles, e.g., 25% (on) or more (such as, for example, 5 seconds on/15 seconds off) can create significant cooling since the mass of the cleaning nozzle does not warm significantly during the off period.

EXAMPLE

The following experiment was conducted with the cleaning unit described above. The nozzle was positioned at heights of ½ inch and ¼ inch above a work piece and a jet of steam from a steam cleaning unit was introduced from 18 inches away. A baseline data point was taken without the jet of steam directed at a work piece at room temperature of 69 degrees Fahrenheit, RH=13%, standoff=½ inch, for 2 minutes. No icing was seen. Steam, visible as a vapor (100% humidity), was then directed at the nozzle positioned ½ inch above the work piece while the nozzle delivered $CO_2$ gas for 2 minutes. Ice was built up between the work piece and nozzle tip. A sheath gas jacket as described in FIG. 2B was then installed (supply pressure of 25 psig of nitrogen gas) on the gas cleaning nozzle and steam was directed for 2 minutes. Minor icing occurred on the work piece. The same process was repeated but manually moved the manifold at 2 ips under the gas cleaning assembly. No icing was seen. The experiment was repeated with ¼ inch standoff. Some icing was seen. Finally, shop air that was processed with a Speedair-refrigerated dryer at 25 psig was used in place of the nitrogen. No visual differences were seen in the results. Both nitrogen and processed shop air circulated around the nozzle in the sheath gas jacket significantly reduced the amount of icing under the tip of the gas cleaning nozzle under direct steam conditions.

Still further embodiments are in the scope of the claims. For example, the sheath gas arrangement can be used to clean other small, delicate parts, for example circuit boards and optics. The sheath gas maybe released from the jacket in directions other than toward or away from the work piece. For example a gas flow opening on the side of the jacket may release the gas sheath flow laterally. The sheath gas may be heated prior to introduction to the jacket.

What is claimed is:

1. A gas cleaning nozzle assembly, comprising:
 a nozzle outlet by which cleaning gas is directed and a sheath gas jacket that surrounds at least a portion of the nozzle and directs a sheath gas into contact with said nozzle.

2. A gas cleaning nozzle assembly of claim 1, wherein the nozzle outlet and sheath gas jacket direct the sheath gas and cleaning gas generally towards a work piece.

3. The cleaning nozzle assembly of claim 1 wherein the sheath gas jacket and nozzle outlet direct the sheath gas and cleaning gas in generally opposite directions.

4. The gas cleaning nozzle assembly of claim 1 wherein the nozzle outlet and the sheath gas jacket direct the sheath gas in a direction generally toward the work piece and generally away from the work piece.

5. The gas cleaning nozzle assemble of claim 4 wherein the flow of the sheath gas towards the work piece is less than the flow away from the work piece.

6. The gas cleaning nozzle assemble of claim 1 wherein the sheath gas jacket comprises a generally tubular fitting having a first opening adapted to receive an exit end of the nozzle outlet and a second opening adapted to receive an inlet end of the nozzle outlet.

7. The gas cleaning nozzle assemble of claim 6 wherein the sheath gas jacket includes a sheath gas inlet for introducing sheath gas between the first opening and second opening.

8. A method using a gas jet cleaning nozzle with the following steps:
   directing a cleaning gas through a nozzle and
   directing a sheath gas around the nozzle.

9. The method of claim 8 wherein the cleaning gas is carbon dioxide.

10. The method of claim 8 wherein the sheath gas is nitrogen.

11. The method of any one of claims 8–10 comprising cleaning a print head component by directing the cleaning gas toward said component.

* * * * *